US 6,559,375 B1

(12) United States Patent
Meissner et al.

(10) Patent No.: US 6,559,375 B1
(45) Date of Patent: May 6, 2003

(54) ORGANIC SOLAR CELL OR LIGHT-EMITTING DIODE (75) Inventors: Dieter Meissner, Buchen (DE); Jörn Rostalski, Dreieich (DE)

(73) Assignee: Dieter Meissner, Buchen (DE)

( * ) Notice: Subject to any disclaimer, the term of this patent is extended or adjusted under 35 U.S.C. 154(b) by 0 days.

(21) Appl. No.: 09/856,875

(22) PCT Filed: Nov. 26, 1999

(86) PCT No.: PCT/DE99/03759
§ 371 (c)(1),
(2), (4) Date: Sep. 7, 2001

(87) PCT Pub. No.: WO00/33396
PCT Pub. Date: Jun. 8, 2000

(30) Foreign Application Priority Data

Nov. 27, 1998 (DE) .......................................... 198 54 938
Feb. 11, 1999 (DE) .......................................... 199 05 694

(51) Int. Cl.$^7$ ............................................... H01L 51/20
(52) U.S. Cl. ...................... 136/263; 136/252; 136/255; 136/256; 257/43; 257/40; 257/79; 257/80; 257/461; 257/464; 257/431; 362/800
(58) Field of Search .............................. 136/252, 255, 136/263, 256; 257/43, 40, 79, 80, 461, 464, 431; 362/800

(56) References Cited

U.S. PATENT DOCUMENTS 4,175,981 A * 11/1979 Loutfy et al. ................ 136/263
4,625,071 A * 11/1986 Delahoy et al. ............. 136/250
5,482,570 A * 1/1996 Saurer et al. ................ 136/255

FOREIGN PATENT DOCUMENTS

| FR | 2 964 451 | 2/1994 |
| WO | 96/31909 | 10/1996 |
| WO | WO 99/49525 A1 * | 9/1999 |

OTHER PUBLICATIONS

S. Antohe et al., "Three–Layered Photovoltaic Cell with an Enlarged Photoactive Region of Codeposited Dyes", Aug. 1996, *J. Phys. III*, Paris, France, 1133–1144.

H. Imahori et al., "Donor–Linked Fullerenes: Photoinduced Electron Transfer and Its Potential Application", Germany, VCH Verlagsgesellschaft, Weinheim, vol. 9, No. 7, Jun. 1, 1997, pp. 537–546.

* cited by examiner

*Primary Examiner*—Alan Diamond
(74) *Attorney, Agent, or Firm*—Young & Thompson (57) ABSTRACT

A component with a first layer which mainly includes a first material, a second layer which mainly includes a second material and at least one intermediate layer being located between the first layer and the second layer. The component is configured in such a way that the intermediate layer contains the first and/or the second material and that at least one substance is colloidally dissolved in the intermediate layer and that the substance has another conductibility than the first or second material.

30 Claims, 5 Drawing Sheets

ORGANIC SOLAR CELL OR LIGHT-EMITTING DIODE

BACKGROUND OF THE INVENTION

The invention relates to a component with a first layer which consists essentially of a first material, a second layer which consists essentially of a second material, and at least one intermediate layer located between the first layer and the second layer.

DESCRIPTION OF THE RELATED ART

A generic component is known from U.S. Pat. No. 5,698,048. In this case, between the two layers there is an intermediate layer which contains a polymer, but not one of the two materials of the layer.

U.S. Pat. No. 5,454,880 discloses a diode in which one layer of a polymer and another layer which contains fullerene lie adjacent to one another. Here the polymer is made such that it acts as a donor while the fullerenes act as acceptors for charge carriers.

SUMMARY OF THE INVENTION

The object of the invention is to devise a generic component which has an efficiency as high as possible for sending and/or receiving electromagnetic radiation, especially light.

In particular, a solar cell with efficiency as high as possible will be created by the invention.

This object is achieved as claimed in the invention by making a generic component such that the intermediate layer contains the first material and/or the second material and that in the intermediate layer a least one material is colloidally dissolved and that the substance has a conductivity different from that first material or the second material.

Therefore the invention calls for devising a component which has at least two layers of two materials with different conductivities and at least one intermediate layer between them. The intermediate layer contains at least one of the two materials and a colloidally dissolved substance. Here colloidally dissolved means that the substance consists of particles or forms them by a chemical reaction or agglomeration and that these particles are located in the material. The particles preferably have a size of 1 nm to 1 microns. Preferably the particles are located in the material such that they form a network via which charge carriers can flow, for example in a percolation mechanism. It is advantageous, but not necessary, that the charge carriers can flow in the material. The colloidally dissolved substance has a conductivity which is different both from the conductivity of the first material and also from the conductivity of the second material. Here it is less a matter of the absolute level of conductivity than of the manner in which the charge carriers are transported.

The first feasible embodiment of the component is characterized in that it contains exactly one intermediate layer. The intermediate layer consists for example of a first material and the substance dissolved therein or of a second material and a substance dissolved therein or of a mixture or compound of the first material with the second material and the substance dissolved therein.

Another, likewise advantageous embodiment of the component is characterized in that between the first layer and the second layer there are a first intermediate layer and a second intermediate layer, that the first intermediate layer adjoins the first layer and that the second intermediate layer adjoins the second layer.

The intermediate layers can be distinguished for example by the first intermediate layer containing essentially the first material and the substance colloidally dissolved therein and by the second intermediate layer consisting essentially of the second material and the substance colloidally dissolved therein.

Furthermore, it is advantageous that in the first intermediate layer a first substance is colloidally dissolved and that in the second intermediate layer a second substance is colloidally dissolved.

An increased current yield or radiation yield is achieved by the first and/or the second material being a semiconductor.

It is especially feasible for the first material and/or the second material to be an organic semiconductor.

For use of the component as a solar cell or as a component of a solar cell it is advantageous for the first material and/or the second material to have suitable light absorption.

Feasibly the organic semiconductor contains substituted perylene pigments. In particular, it is feasible for the perylene pigments to be substituted perylene carboxylic acid imides.

A further increase of the efficiency is achieved by the first material having a type of conductivity different than the second material.

It is especially advantageous that the second material contains an organic complex compound, especially an organometallic complex compound. Here it is preferably a phthalocyanin compound. Use of hydrogen phthalocyanin or metal phthalocyanins, especially zinc phthalocyanin, is especially advantageous.

One preferred embodiment of the component as claimed in the invention is characterized by the substance consisting of a semiconductor material.

The concept semiconductor material comprises all substances known from semiconductor technology as semiconductor materials. The concept of semiconductor material here is however not limited to materials which are generally called semiconductors, but rather comprises all materials which in at least one modification of particle size have a band gap between the valency band and the conduction band. For the charge transport of charge carriers of one type to be achieved what matters is simply the energy position and energy level in the substance. Thus, for example, in the removal of electrons simply one position of the conduction band in the substance which corresponds to the position of the conduction band or of the valency band in the material is necessary. Here the position of the valency band in the substance and thus the band gap are not important. In hole conduction it applies accordingly that the valency band of the substance is feasibly located at an energy level which corresponds to the energy level of the valency band or the conduction band of the material. Examples of the semiconductor material are $SnO_2$ and $TiO_2$.

As a result of quantum size effects the conductivity of the particles of the substance can be different from macroscopic conductivity. For the invention electrical conduction is feasible to the extent by which the charge carriers of one type of conductivity can be removed on a controlled basis. An increase of conductivity by a suitable nanostructure by which for example one substance which macroscopically forms a semiconductor acts as a metal in the layer as claimed in the invention is therefore included at the same time. This also applies to macroscopically metallic materials which as small particles become semiconductors.

One preferred embodiment of the component is characterized by the substance consisting of an organic semiconductor material.

In particular it is feasible for the substance to contain a carbon modification, the carbon modification having a band gap, like for example $C_{60}$, $C_{70}$ or graphene.

Especially effective charge transport with simultaneous prevention of electrical short circuits is achieved by the substance being present essentially in the form of particles.

The particles are for example individual molecules, especially individual fullerene molecules, or clusters of several molecules.

The particles preferably have a size from 1 nm to 1 micron, an upper particle size of 200 nm being preferred.

A clear increase of charge transport is achieved in that particles have a concentration which is so great that percolation is formed.

A further increase of efficiency in sending and/or receiving electromagnetic radiation can be achieved by spatially varying the concentration of the substance.

This version of the invention therefore calls for devising a component which has an intermediate layer within which the concentration of a colloidally dissolved substance varies spatially.

The intermediate layer is located between the first layer and the second layer, its being possible that these layers are located within a common carrier material. The first and the second layer can differ both little from one another and can also consist of completely different materials.

Preferably the first and the second material differ simply in that they are doped differently.

One feasible embodiment of the component is characterized in that the concentration of the substance varies within the intermediate layer.

It is especially feasible for the component to be made such that there are at least two substances in the intermediate layer.

Furthermore, it is advantageous for one of the substances to have a concentration which varies spatially differently from the concentration of the other substance.

One feasible embodiment of the component is characterized by the first substance having a Fermi level which differs by at least 20 meV from the Fermi level of the second substance.

Furthermore, it is advantageous that the first substance has a different type of conductivity than the other substance.

One feasible embodiment of the component is characterized in that the one substance has a band gap different from the first substance.

Furthermore, it is advantageous that the band gap of the first substance differs from the band gap of the second substance by at least 20 meV.

BRIEF DESCRIPTION OF THE DRAWINGS

Other advantages, particulars and feasible developments of the invention follow from the dependent claims and the following description of one preferred embodiment using the drawings.

DESCRIPTION OF THE PREFERRED EMBODIMENTS

Figure 1:
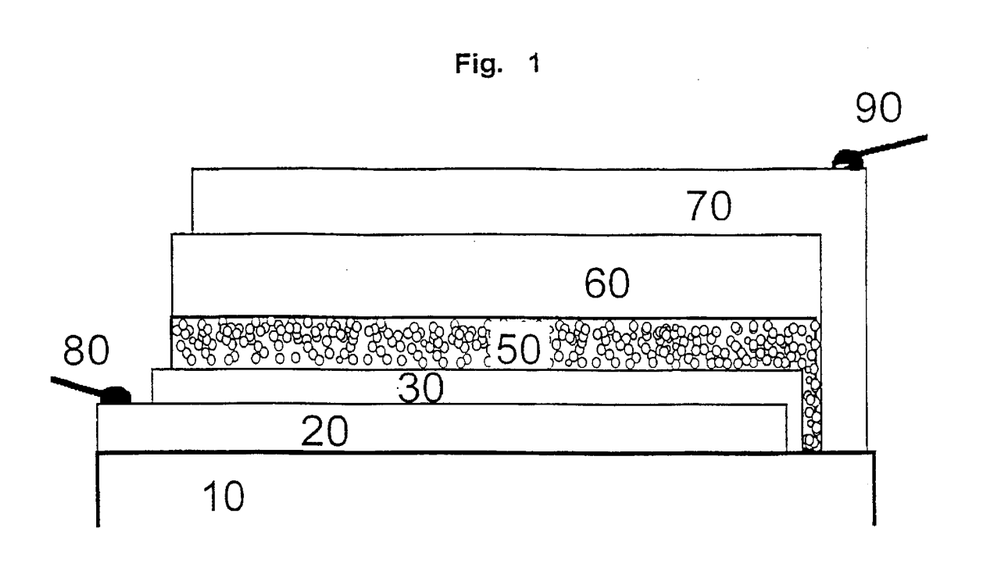
FIG. 1 shows a cross section through a first embodiment of the component as claimed in the invention.

The component shown in FIG. 1 is for example a solar cell or an organic light emitting diode. The component contains a layer system applied to a substrate 10, for example glass, especially silicate glass, consisting of a transparent contact layer 20, a first layer 30, a second layer 60, an intermediate layer 50 and a contact-making layer 70.

A contact 80 is applied to the side region of the transparent contact layer 20. Another contact 80 is located on the upper contact-making layer 70. The transparent contact layer 20 has a thickness between 5 nm and 1 micron, preferably 10 nm to 20 nm. The thickness of the contact layer 20 can be chosen to be variable.

The first layer 30 is located on the transparent contact layer. It is possible for the first layer 30 to extend in sections to the substrate 10 as well, for example, in regions in which the transparent contact layer 20 was etched away beforehand. To achieve interface effects between the transparent contact layer 20 and the first layer 30 this is however not necessary.

But it is a good idea for production engineering for the first layer 30 to project over the transparent contact layer 20, because in this way a short circuit is avoided between the contact 90 and the transparent contact layer 20.

The first layer 30 has a thickness between 5 nm and 1000 nm, preferably 10 nm to 200 nm. The thickness of the layer 30 can be chosen to be variable because to achieve interface effects between the layers 30 and 60 the dimensions of the layers 30, 60 are not important.

The contact layer 20 consists preferably of a transparent material which is especially a transparent conductive oxide. The transparent properties are necessary in an application as a solar cell or as a light emitting diode with light which penetrates through the substrate 10, so that the light rays penetrating through the substrate 10 are not absorbed by the contact layer 20. For light incidence or emergence through the layer 60 it is not necessary to make the contact layer 20 transparent.

The first layer 30 consists preferably of an organic semiconductor of the first type of conductivity. For example it is an n-conductive material, preferably perylene-3,4,9,10-tetracarboxylic acid-N,N'-dimethylimide (MPP).

The second layer 60 consists preferably of a second semiconductor layer. Here it is especially a material with the opposite type of conductivity, preferably zinc phthalocyanin (ZnPc). A contact-making layer 70 is used for electrical connection of the layer 60. For example, the contact-making layer 70 consists of gold. Gold has the special advantage that it combines high conductivity with high chemical stability.

The intermediate layer 50 contains the same material as the layer 60, but is enriched with a fullerene or a semiconductor oxide such as $TiO_2$. When using the component as a solar cell, the enrichment is preferably a maximum 60%. When the component is used as a light emitting diode the enrichment can be even higher.

Figure 2:
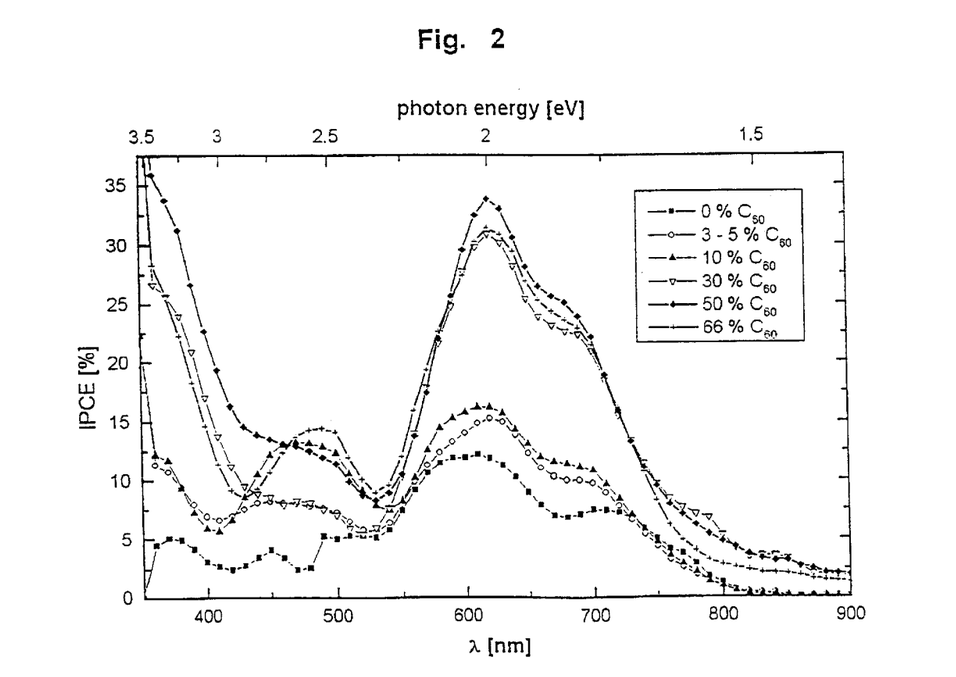
FIG. 2 shows the external quantum yield as incident photon to current efficiency (IPCE) as a function of the wavelength of the incident light for various concentrations of $C_{60}$.

FIG. 2 shows solar current yields by external quantum yield as the incident photon to current efficiency (IPCE) as a function of the wavelength of the incident light for different concentrations of $C_{60}$.

Here they are the measured values which were measured for the solar cell shown in FIG. 1. It appears that the current yield increases with the increasing concentration of $C_{60}$. An especially great rise occurs at a concentration of $C_{60}$ of more than 10%. One possible explanation for this unexpectedly high rise could be the occurrence of percolation.

Figure 3:
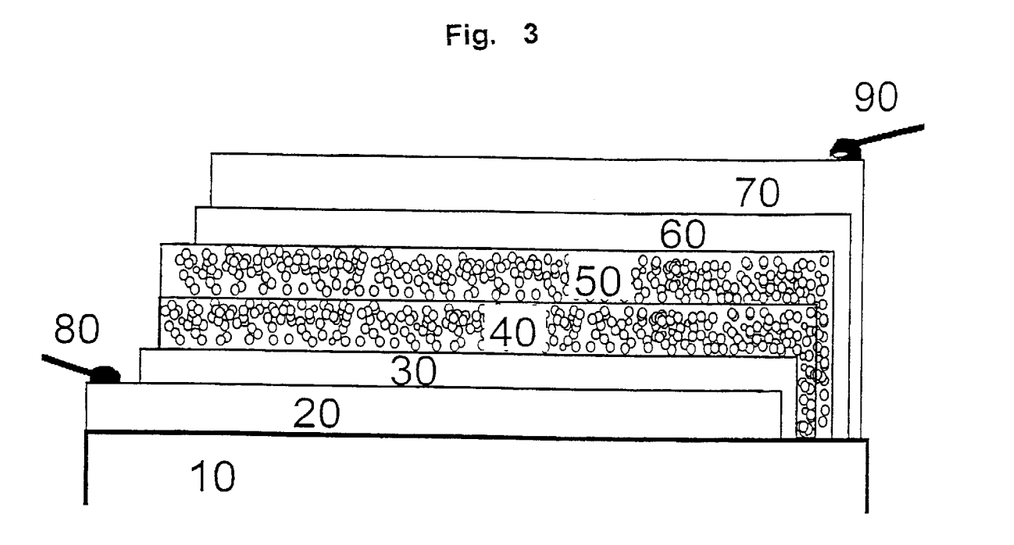
FIG. 3 shows a cross section through a second embodiment of a component as claimed in the invention.

The component shown in FIG. 1 is for example a solar cell or an organic light emitting diode. The component contains a layer system applied to a substrate 10, for example glass, especially silicate glass, consisting of a transparent contact layer 20, a first layer 30, a second layer 60, a first intermediate layer 40, a second intermediate layer 50 and a contact-making layer 70.

A contact 80 is applied to the side region of the transparent contact layer 20. Another contact 90 is located on the upper contact-making layer 70. The transparent contact layer 20 has a thickness between 5 nm and 1000 nm, preferably 10 nm to 200 nm. The thickness of the layer can be chosen to be variable.

The first layer 30 is located on the transparent contact layer. It is possible for the first layer 30 to extend in sections to the substrate 10 as well, for example, in regions in which the transparent contact layer 20 was etched away beforehand.

It is a good idea for production engineering for the first layer 30 to project over the transparent contact layer 20, because in this way a short circuit is avoided between the contact 90 and the transparent contact layer 20.

The first layer 30 has a thickness between 5 nm and 1000 nm, preferably 10 nm to 200 nm. The thickness of the layer can be chosen to be variable because to achieve the interface effects the dimensions of the layers are not important.

The contact layer 20 consists of a transparent material which is especially a transparent conductive oxide in an application as a solar cell with light incidence through the substrate 10 or as a light emitting diode with light emergence through the substrate 10.

In the embodiment shown using FIG. 1 the first layer 30 consists preferably of an organic semiconductor material of the first type of conductivity. For example, it is an n-conductive material, preferably perylene-3,4,9,10-tetracarboxylic acid N,N'-dimethylimide (MPP).

The second layer 60 consists preferably of a second semiconductor material. Here it is especially a material with the opposite type of conductivity, preferably zinc phthalocyanin (ZnPc). A contact-making layer 70 is used for electrical connection of the layer 60. For example, the contact-making layer 70 consists of gold. Gold has the special advantage that it combines high electrical conductivity with high chemical stability.

The first intermediate layer 40 contains in any case the material contained in the first layer 30 and possibly also the material contained in the second layer 60, preferably at least one organic semiconductor. NPP or ZnPc are especially suited. Furthermore, the intermediate layer 40 is enriched with a fullerene or another semiconductor material such as $TiO_2$. When using the component as a solar cell the enrichment is preferably a maximum 60%. When the component is used as a light emitting diode the enrichment can be even higher.

The second intermediate layer 50 contains the same material as the layer 60, but is enriched with another fullerene or a semiconductor material such as $TiO_2$. When using the component as a solar cell the enrichment is preferably a maximum 60%. When the component is used as a light emitting diode the enrichment can be even higher.

Figure 4:
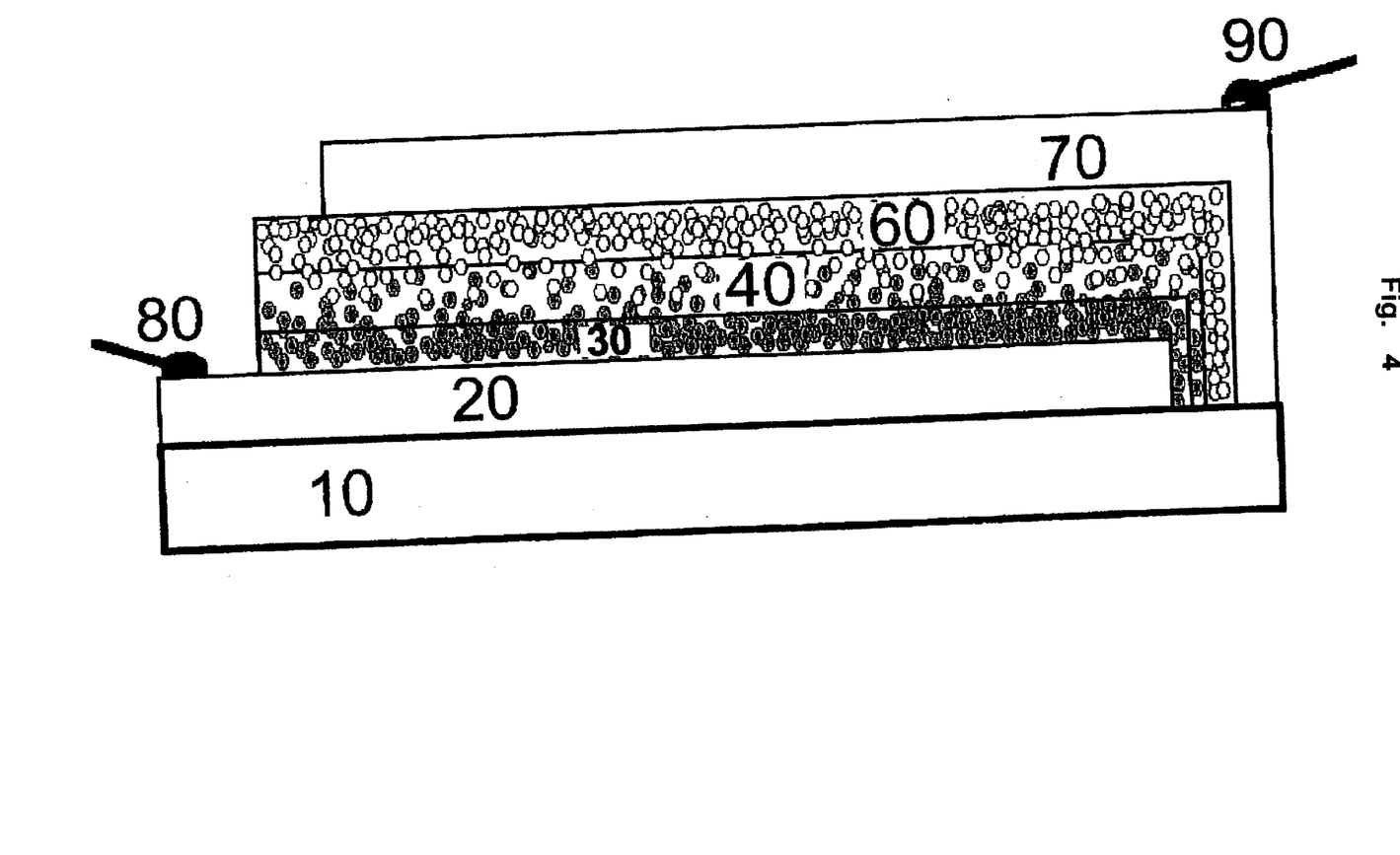
FIG. 4 shows a cross section through another embodiment of a component as claimed in the invention.

The component shown in FIG. 4 is for example a solar cell or an organic light emitting diode. The component contains a layer system applied to a substrate 10, for example glass, especially silicate glass, consisting of a transparent contact layer 20, a multiple layer and a contact-making layer 70. The multiple layer consists preferably of a first layer 30, a second layer 60, and an intermediate layer 40.

A contact 80 is applied to the side region of the transparent contact layer 20. Another contact 90 is located on the upper contact-making layer 70. The transparent contact layer 20 has a thickness between 5 nm and 1 micron, preferably 10 nm to 200 nm. The thickness of the contact layer 20 can be chosen to be variable.

The first layer 30 is located on the transparent contact layer. It is possible for the first layer 30 to extend in sections to the substrate 10 as well, for example, in regions in which the transparent contact layer 20 was etched away beforehand. To achieve interface effects between the transparent contact layer 20 and the first layer 30 this is however not necessary.

But it is a good idea for production engineering for the first layer 30 to project over the transparent contact layer 20, because in this way a short circuit is avoided between the contact 90 and the transparent contact layer 20.

The first layer 30 has a thickness between 5 nm and 1000 nm, preferably 10 nm to 200 nm. The thickness of the layer can be chosen to be variable because to achieve interface effects between the layers 30 and 60 the dimensions of the layers 30, 60 are not important.

The contact layer 20 consists preferably of a transparent material which is especially a transparent conductive oxide. The transparent properties are necessary in an application as a solar cell or as a light emitting diode with light which penetrates through the substrate 10, so that the light rays penetrating through the substrate 10 are not absorbed by the contact layer 20. For light incidence or emergence through the layer 60 it is not necessary to make the contact layer 20 transparent.

The layer 30 consists essentially of a matrix material and a semiconductor colloidally dissolved therein. The semiconductor preferably has the first type of conductivity. For example, it is an n-conductive material, preferably cadmium sulfide (CdS), n-doped gallium arsenide (GaAs), n-doped silicon, n-doped cadmium tellurite (CdTe) or a substituted perylene pigment, especially a methylene-substituted perylene pigment, especially perylene-3,4,9,10-tetracarboxylic acid-N,N'-dimethylimide (MPP).

The second layer 60 consists preferably of a matrix material and a semiconductor material colloidally dissolved therein. The second semiconductor material is especially a material with a type of conductivity opposite the first semiconductor material, for example, p-doped zinc phthalocyanin (ZnPc), p-doped gallium arsenide (GaAs) or p-doped silicon.

A contact-making layer 70 is used for electrical connection of the layer 60. For example, the contact-making layer 70 consists of gold to achieve high electrical conductivity and high chemical stability.

Between the first layer 30 and the second layer 60 there is at least one intermediate layer 40. The intermediate layer 40 contains a suitable matrix material. When the layer 30 has the same matrix material as the layer 60, it is a good idea for the intermediate layer 40 to also consist of this matrix material. If, which is likewise possible, the layer 30 has a different matrix material than the layer 60, it is preferably for the intermediate layer 40 to consist of a mixture or a solution of matrix material with one or more substances colloidally dissolved therein.

The multiple layer is produced by alternating immersion in solutions of different concentrations. In this way the layers which form the multiple layer are deposited in succession.

In one preferred implementation of the process a system of layers is deposited on the substrate 10 as follows: Wetting, especially dip-coating, for example of indium tin oxide (ITO), is done with a colloidal, especially aqueous solution of particles, for example CdTe particles first, the substrate 10 being immersed in succession in solutions of various concentrations. The lengths of immersion and pulling speeds are varied such that first only CdTe particles, then mixtures with variable composition, then pure CdS particles build up the layer.

The colloidal solution from which the layers are deposited by dip coating can contain a stabilizer, but this is not necessary. One preferred stabilizer is polysulfate which in solution forms a jacket around the particles which prevents them from coalescing. When the layers are deposited the stabilizer forms a matrix material in which the particles are embedded.

If the colloidal solution does not contain a stabilizer, there is a space charge zone—ionic layer—around the particles, with charges which prevent the particles from coalescing. The ions in the space charge zone are incorporated into the deposited layer at the same time during deposition.

Figure 5:
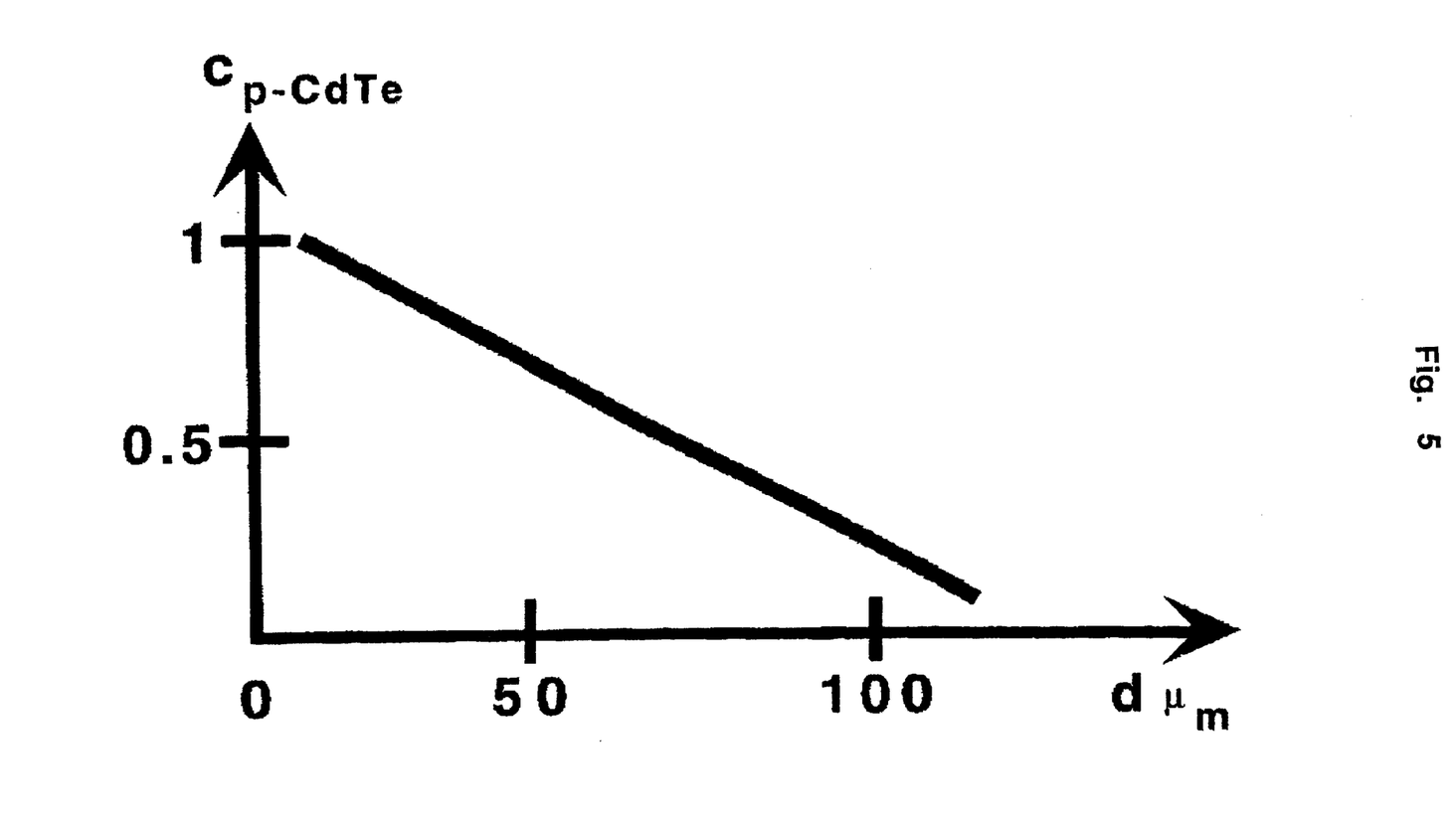
FIG. 5 shows the concentration of the first dopant as a function of its distance to the region of the first layer and FIG. 6 shows the concentration of the second dopant as a function of its distance to the region of the first layer.

FIG. 5 shows the concentration of a first dopant as a function of its distance to the region of the first layer 30. The first dopant is for example CdTe. In a region of roughly 100 microns the concentration of the first dopant decreases largely linearly.

By means of a largely linear decrease of the concentration of the first dopant there is an essentially constant concentration gradient in the roughly 100 micron wide area for the first dopant.

Figure 6:
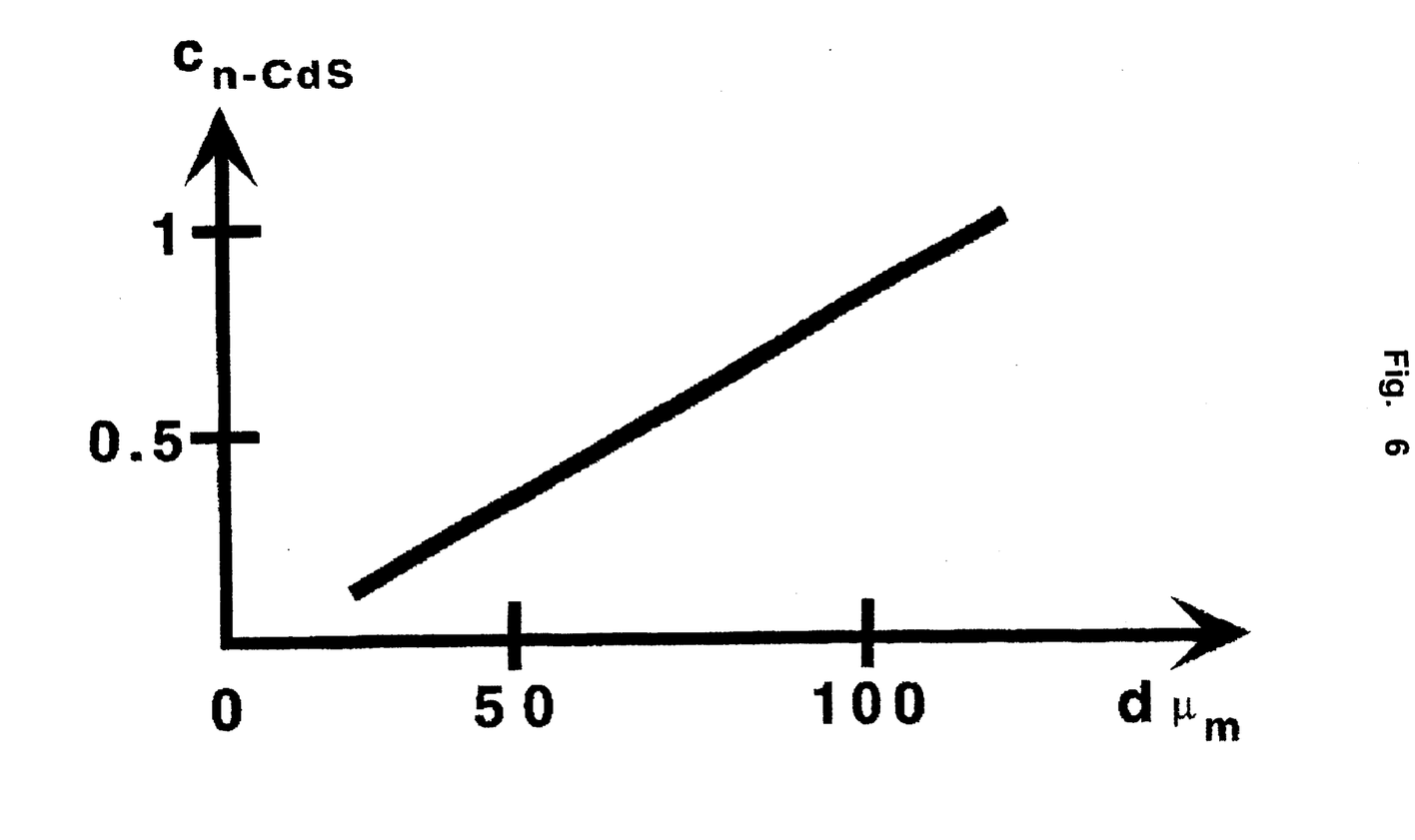

FIG. 6 shows the concentration of the second dopant as a function of its distance to the region of the first layer 30. The second dopant is for example CdS. In a region of roughly 100 microns the concentration of the second dopant increases largely linearly.

By means of a largely linear increase of the concentration of the second dopant there is likewise an essentially constant concentration gradient in a roughly 100 micron wide area for the second dopant.

In the especially preferred case which is shown, the concentration gradients of the dopants differ only by their sign.

The concentration variation shown in FIGS. 5 and 6 is preferred; the preferred embodiments of the invention with a changing concentration are however in no way limited to linear concentration changes.

Reference Number List

10 substrate
20 contact layer
30 first layer
40 first intermediate layer
50 second intermediate layer
60 second layer
70 contact-making layer
80 contact
90 contact

What is claimed is:

1. Component with a first layer (30) which consists essentially of a first material, a second layer (60) which consists essentially of a second material, and at least one intermediate layer (40, 50) which is located between the first layer (30) and the second layer (60), characterized in that the intermediate layer (40, 50) contains the first material and/or the second material and that in the intermediate layer (40, 50) at least one substance is colloidally dissolved and that the substance has a conductivity less than the first material or the second material,
   wherein between the first layer (30) and the second layer (60) there are a first intermediate layer (40) and a second intermediate layer (50), that the first intermediate layer (40) adjoins the first layer (30) and that the second intermediate layer (50) adjoins the second layer (60).

2. Component as claimed in claim 1, wherein the first intermediate layer (40) contains essentially the first material and the colloidally dissolved substance and wherein the second intermediate layer (50) consists essentially of the second material and the colloidally dissolved substance.

3. Component as claimed in claim 1, wherein the first intermediate layer (40) contains essentially the first material and the colloidally dissolved substance and wherein the second intermediate layer (50) contains the second material, the first material and the colloidally dissolved substance.

4. Component as claimed in claim 1, wherein the first intermediate layer (40) contains the first material the second material, and the colloidally dissolved substance and wherein the second layer (50) contains essentially the second material and the colloidally dissolved substance.

5. Component as claimed in claim 1, wherein a first substance is colloidally dissolved in the first intermediate layer (40) and wherein a second substance is colloidally dissolved in the second intermediate layer (50).

6. Component as claimed in claim 1, wherein the first material is a semiconductor.

7. Component as claimed in claim 6, wherein the first material is an organic semiconductor.

8. Component as claimed in claim 1, wherein the second material is a semiconductor.

9. Component as claimed in claim 8, wherein the second material is an organic semiconductor.

10. Component as claimed in claim 6, wherein the first material has a different type of conductivity than the second material.

11. Component as claimed in claim 1, wherein the colloidally dissolved substance consists of a semiconductor material.

12. Component as claimed in claim 11, wherein the substance contains $TiO_2$.

13. Component with a first layer (30) which consists essentially of a first material, a second layer (60) which consists essentially of a second material, and at least one intermediate layer (40, 50) which is located between the first layer (30) and the second layer (60), characterized in that the intermediate layer (40, 50) contains the first material and/or the second material and that in the intermediate layer (40, 50) at least one substance is colloidally dissolved and that the substance has a conductivity less than the first material or the second material,
   wherein the colloidally dissolved substance consists of a semiconductor material, and
   wherein the substance contains $SnO_2$.

14. Component as claimed in claim 11, wherein the substance contains an organic semiconductor material.

15. Component with a first layer (30) which consists essentially of a first material, a second layer (60) which consists essentially of a second material, and at least one intermediate layer (40, 50) which is located between the first layer (30) and the second layer (60), characterized in that the intermediate layer (40, 50) contains the first material and/or the second material and that in the intermediate layer (40, 50) at least one substance is colloidally dissolved and that the substance has a conductivity less than the first material or the second material, wherein the substance contains at least one carbon modification which has a band gap.

16. Component as claimed in claim 15, wherein the substance contains at least one component from the group of fullerenes, substituted fullerenes or fullerene derivatives.

17. Component as claimed in claim 16, wherein the substance contains $C_{60}$.

18. Component as claimed in claim 15, wherein the substance contains a graphite carbon modification.

19. Component as claimed in claim 18, wherein the substance contains graphene.

20. Component as claimed in claim 1, wherein the substance is present essentially in the form of particles.

21. Component as claimed in claim 20, wherein the particles essentially have a size between 1 nm and 1 micron.

22. Component as claimed in claim 21, wherein the size of the particles is between 1 nm and 200 nm.

23. Component as claimed in claim 20, wherein the particles have a concentration which is so large that percolation occurs.

24. Component as claimed in claim 1, wherein the concentration of the substance varies spatially.

25. Component as claimed in claim 1, wherein there are at least two substances in the intermediate layer.

26. Component as claimed in claim 25, wherein one of the substances has a concentration which varies differently in space than the concentration of another substance.

27. Component with a first layer (30) which consists essentially of a first material, a second layer (60) which consists essentially of a second material, and at least one intermediate layer (40, 50) which is located between the first layer (30) and the second layer (60), characterized in that the intermediate layer (40, 50) contains the first material and/or the second material and that in the intermediate layer (40, 50) at least one substance is colloidally dissolved and that the substance has a conductivity less than the first material or the second material,
wherein there are at least two substances in the intermediate layer, and
wherein a first substance has a Fermi level which differs by at least 20 meV from the Fermi level of a second substance.

28. Component as claimed in claim 25, wherein a first substance has a different type of conductivity from a second substance.

29. Component as claimed in claim 25, wherein one substance has a different band gap than another substance.

30. Component with a first layer (30) which consists essentially of a first material, a second layer (60) which consists essentially of a second material, and at least one intermediate layer (40, 50) which is located between the first layer (30) and the second layer (60), characterized in that the intermediate layer (40, 50) contains the first material and/or the second material and that in the intermediate layer (40, 50) at least one substance is colloidally dissolved and that the substance has a conductivity less than the first material or the second material,
wherein there are at least two substances in the intermediate layer,
wherein a first substance has a different band gap than a second substance, and
wherein the band gap of the first substance differs from the band gap of the second substance by at least 20 meV.

* * * * *